United States Patent
Kardasz et al.

(10) Patent No.: US 10,147,872 B2
(45) Date of Patent: *Dec. 4, 2018

(54) SPIN TRANSFER TORQUE STRUCTURE FOR MRAM DEVICES HAVING A SPIN CURRENT INJECTION CAPPING LAYER

(71) Applicant: SPIN TRANSFER TECHNOLOGIES, INC., Fremont, CA (US)

(72) Inventors: Bartlomiej Adam Kardasz, Pleasanton, CA (US); Mustafa Michael Pinarbasi, Morgan Hill, CA (US)

(73) Assignee: Spin Transfer Technologies, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/657,498

(22) Filed: Jul. 24, 2017

(65) Prior Publication Data

US 2017/0331033 A1 Nov. 16, 2017

Related U.S. Application Data

(63) Continuation of application No. 14/866,359, filed on Sep. 25, 2015, now Pat. No. 9,728,712.

(60) Provisional application No. 62/150,791, filed on Apr. 21, 2015.

(51) Int. Cl.
*H01L 43/08* (2006.01)
*G11C 11/16* (2006.01)

(52) U.S. Cl.
CPC ............ *H01L 43/08* (2013.01); *G11C 11/161* (2013.01)

(58) Field of Classification Search
CPC ...................................................... H01L 43/08
See application file for complete search history.

(56) References Cited

U.S. PATENT DOCUMENTS

| 341,801 A | 5/1886 | Fox |
| 5,541,868 A | 7/1996 | Prinz |
| 5,629,549 A | 5/1997 | Johnson |

(Continued)

FOREIGN PATENT DOCUMENTS

| CA | 2766141 A1 | 1/2001 |
| CN | 101036195 A | 9/2008 |

(Continued)

OTHER PUBLICATIONS

Mourad El Baraji, et al.; U.S. Appl. No. 15/859,517, filed Dec. 30, 2017, entitled "Microwave Write-Assist in Series-Interconnected Orthogonal STT-MRAM Devices".

(Continued)

*Primary Examiner* — Peniel M Gumedzoe
*Assistant Examiner* — Christopher Johnson
(74) *Attorney, Agent, or Firm* — Arnold & Porter Kaye Scholer

(57) ABSTRACT

A magnetoresistive random-access memory (MRAM) device is disclosed. The device described herein has a spin current injection capping layer between the free layer of a magnetic tunnel junction and the orthogonal polarizer layer. The spin current injection capping layer maximizes the spin torque through very efficient spin current injection from the polarizer. The spin current injection capping layer can be comprised of a layer of MgO and a layer of a ferromagnetic material.

23 Claims, 6 Drawing Sheets

(56) References Cited

U.S. PATENT DOCUMENTS

| | | |
|---|---|---|
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,379,314 B2 | 6/2016 | Park |
| 9,406,876 B2 | 8/2016 | Pinarbasi |
| 9,472,748 B2 | 10/2016 | Kuo et al. |
| 9,484,527 B2 | 11/2016 | Han et al. |
| 9,548,445 B2 | 1/2017 | Lee et al. |
| 9,728,712 B2 * | 8/2017 | Kardasz ............... H01L 43/08 |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |

(56) References Cited

U.S. PATENT DOCUMENTS

| | | |
|---|---|---|
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0216436 A1 | 9/2011 | Igarashi |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim et al. |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0324029 A1 | 11/2017 | Pinarbasi et al. |
| 2017/0331032 A1 | 11/2017 | Chen et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-012546 A | 1/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017527097 A | 9/2017 |

(56) References Cited

FOREIGN PATENT DOCUMENTS

| | | |
|---|---|---|
| JP | 2017532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | 2017131894 A1 | 8/2017 |

OTHER PUBLICATIONS

Pinarbasi, et a.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
Mourad El Baraji, et al.; U.S. Appl. No. 15/859,514, filed Dec. 30, 2017, entitled "Microwave Write-Assist in Orthogonal STT-MRAM".
Manfred Ernst Schabes, et al.; U.S. Appl. No. 15/859,374, filed Dec. 30, 2017, entitled "Switching and Stability Control for Perpendicular Magnetic Tunnel Junction Device".
Manfred Ernst Schabes, et al.; U.S. Appl. No. 15/859,379, filed Dec. 30, 2017, entitled "Perpendicular Magnetic Tunnel Junction Device with Offset Precessional Spin Current Layer".
Mustafa Pinarbasi, et al.; U.S. Appl. No. 15/674,620, filed Aug. 11, 2017, entitled "Polishing Stop Layer(s) for Processing Arrays of Semiconductor Elements".
Notice of Allowance dated Oct. 16, 2017 in U.S. Appl. No. 14/814,036; 16 pages.
Mustafa Michael Pinarbasi, et al.; U.S. Appl. No. 15/794,871, filed Oct. 26, 2017, entitled "Precessional Spin Current Structure for MRAM".
Michail Tzoufras, et al.; U.S. Appl. No. 15/858,950, filed Dec. 29, 2017, entitled "AC Current Pre-Charge Write-Assist in Orthogonal STT-MRAM".
Marcin Jan Gajek, et al.; U.S. Appl. No. 15/858,988, filed Dec. 29, 2017, entitled "Self-Generating AC Current Assist in Orthogonal STT MRAM".
Eric Michael Ryan, et al.; U.S. Appl. No. 15/859,015, filed Dec. 29, 2017, entitled "Shared Oscillator (STNO) for MRAM Array Write-Assist in Orthogonal STT-MRAM".
Michail Tzoufras, et al.; U.S. Appl. No. 15/859,030, filed Dec. 29, 2017, entitled "AC Current Write-Assist in Orthogonal STT-MRAM".
Kadriye Deniz Bozdag, et al.; U.S. Appl. No. 15/859,047, filed Dec. 29, 2017, entitled "Three-Terminal MRAM with AC Write-Assist for Low Read Disturb".
Manfred Ernst Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Manfred Ernst Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Manfred Ernst Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
Andrew Kent, et al.; U.S. Appl. No. 61/715,111, filed Oct. 17, 2012, entitled "Inverted Orthogonal Spin Transfer Layer Stack".
International Search Report and Written Opinion dated Jul. 10, 2015 in PCT/US2015/021580; 12 pages.
Pinarbasi, et al.; U.S. Appl. No. 14/814,036, filed Jul. 30, 2016, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
S. Ikeda, et al.; "A perpendicular-anisotropy CoFeB—MgO magnetic tunnel junction"; Nature Materials, vol. 9, Sep. 2010; pp. 721-724; 4 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
NonFinal Office Action dated Jan. 20, 2016 in U.S. Appl. No. 14/242,419; 17 pages.
Final Office Action dated Jul. 9, 2015 in U.S. Appl. No. 14/242,419; 19 pages.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Feb. 6, 2017 in U.S. Appl. No. 14/814,036; 22 pages.
NonFinal Office Action dated Dec. 9, 2017 in U.S. Appl. No. 14/866,359; 26 pages.
NonFinal Office Action dated Jan. 25, 2017 in U.S. Appl. No. 15/097,576; 17 pages.
NonFinal Office Action dated Dec. 23, 2016 in U.S. Appl. No. 15/093,367; 13 pages.

(56) References Cited

OTHER PUBLICATIONS

NonFinal Office Action dated Feb. 8, 2017 in U.S. Appl. No. 15/174,482; 10 pages.
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Final Office Action dated Jun. 9, 2017 in U.S. Appl. No. 14/814,038; 19 pages.
Manfred Ernst Schabes, et al.; U.S. Appl. No. 15/634,629, filed Jun. 27, 2017, entitled "MRAM with Reduced Stray Magnetic Fields".
Soo-Man Seo, et al.; "Current-induced synchronized switching of magnetization;" Applied Physics Letters 101; 2012 American Institute of Physics; Aug. 7, 2012; 6 pages.
Mustafa Pinarbasi, et al.; U.S. Appl. No. 15/656,398, filed Jul. 21, 2017, entitled "Memory Cell Having Magnetic Tunnel Junction and Thermal Stability Enhancement Layer".
Notice of Allowance dated Jul. 27, 2017 in U.S. Appl. No. 15/097,576; 22 pages.
International Search Report and Written Opinion dated May 10, 2018 in PCT/US2018/014645; 14 pages.
International Search Report and Written Opinion dated May 30, 2018 in PCT/US2018/014641; 13 pages.

\* cited by examiner

SPIN TRANSFER TORQUE STRUCTURE FOR MRAM DEVICES HAVING A SPIN CURRENT INJECTION CAPPING LAYER

CROSS-REFERENCE TO RELATED APPLICATION

This application is a continuation of U.S. patent application Ser. No. 14/866,359, filed Sep. 25, 2015, now U.S. Pat. No. 9,728,712. This application also claims the benefit of Provisional Application No. 62/150,791, filed Apr. 21, 2015. Priority to this provisional application is expressly claimed, and the disclosure of the provisional application is hereby incorporated herein by reference in its entirety.

FIELD

The present patent document relates generally to spin-transfer torque magnetic random access memory and, more particularly, to a spin current injection capping layer between the free layer and the orthogonal polarizer that maximizes the spin torque through very efficient spin current injection from the polarizer.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices.

One of the promising MRAM technologies, OST-MRAM, uses Orthogonal Spin Transfer (OST) torque, in which orthogonal torque is applied to a free (storage) magnetic layer via a spin polarized current created by a polarizing layer (POL). Thus, the OST-MRAM device may consist of a polarizing layer, a spacer adjacent to a free layer, a free layer, an insulator layer for spin polarized tunneling, and a reference layer. The free layer, insulator and reference layer form a magnetic tunnel junction ("MTJ"). This OST configuration offers several advantages. Some of these advantages are bipolar switching, faster switching and lower write error rates for the device.

Spin transfer torque uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, torque can switch the magnetization of the free layer, which, in effect, writes either a "1" or a "0" based on whether the free layer is in the parallel or anti-parallel states relative to the reference layer.

FIG. 1 illustrates a magnetic tunnel junction ("MTJ") stack 100 for a conventional MRAM device with a perpendicular polarizer. As shown, stack 100 includes one or more seed layers 110 provided at the bottom of stack 100 to initiate a desired crystalline growth in the above-deposited layers. An antiferromagnetic layer 112 is disposed over seed layers 110. Furthermore, MTJ 130 is deposited on top of synthetic antiferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction parallel to its plane. As also seen in FIG. 1, free layer 136 also has a magnetization direction parallel to its plane, but its direction can vary by 180 degrees.

The first magnetic layer 114 is disposed over seed layer 110. SAF layer 120 also has an antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction perpendicular to its plane and orthogonal to the magnetic direction of the reference layer 132 and free layer 136. Polarizer 150 is provided to polarize a current of electrons ("spin-aligned electrons") applied to MTJ structure 130. Further, one or more capping layers 160 can be provided on top of perpendicular polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

Conventional MRAM devices such as those described in U.S. Pat. No. 6,532,164 to Redon describe embodiments having a nonmagnetic metallic conductor layer in between the polarizer layer and MTJ. One of the key problems of the approach in both Redon and all other such OST MRAM devices is the lack of a control of orthogonal torque transfer and efficiency of spin transfer torque through metallic (i.e., conductive) spacers 140 separating free layer 136 of the MTJ from the polarizing layer 150.

In devices such as Redon, the spacer layer 140 was constructed with a high resistivity non-magnetic metal such a Ta or a low resistivity transition metal such as Cu, both of which have disadvantages. High resistivity non-magnetic metals such as Ta are known to have short spin diffusion length, e.g., approximately one nanometer, which suppresses spin transfer torque from the polarizing layer 150. On the other hand low resistivity transition metals such as Cu provide very good spin torque transfer due to a long spin diffusion length (250 nm at room temperature). However the high tunnel magnetoresistance (TMR) ratio decreases significantly when Cu is used as a spacer between the polarizer and the MTJ due to Cu thermal diffusion. This leads to poor performance of the MTJ device.

SUMMARY

The device described herein addresses the problems with prior approaches. It has a spin current injection capping layer between the free layer and the orthogonal polarizer that maximizes the spin torque through very efficient spin current injection from the polarizer while enabling: 1) high TMR with a desirable RA (resistance area product), 2) Lower free layer damping constant, 3) Lower free layer effective magnetization An MRAM device is disclosed herein is an orthogonal spin transfer torque structure with a MgO/ferromagnet cap and Fe/CoFeB free layer structure (OST-dMgO) for high efficiency spin transfer torque and low critical current switching—MRAM application. MgO is Magnesium Oxide. Fe is Iron. CoFeB is cobalt iron boron. dMgO is dual MgO that represents the main barrier MgO and the cap MgO.

In one embodiment, a magnetic device includes a magnetic tunnel junction having a magnetic reference layer and a magnetic free layer. The magnetic reference layer and the magnetic free layer are separated by a non-magnetic tunneling barrier layer. The magnetic reference layer has a magnetic vector having a fixed magnetic direction. The magnetic free layer has a magnetic vector with a variable magnetic direction. The magnetic device also has a magnetic polarizer layer having magnetic vector with a direction that is perpendicular to the magnetic direction of the magnetic reference layer and the magnetic free layer. The magnetic polarizer aligns the polarity of electrons of electric current passing therethrough in the magnetic direction of the magnetic polarizer, thereby creating a spin current. The magnetic device also comprises a spin current injection capping layer disposed between the magnetic tunnel junction and the magnetic polarizer. The spin current injection capping layer comprises a non-magnetic insulator on the magnetic free layer and a magnetic conductor on the non-magnetic insulator. The spin current injection capping layer injects spin polarized current into the magnetic tunnel junction through tunneling.

In another embodiment, the magnetic device further comprises an insertion layer that is disposed in between the magnetic free layer and the non-magnetic tunneling barrier layer.

In another embodiment, the insertion layer comprises an Fe film having a thickness of 0.2 nm to 0.5 nm.

In another embodiment, the magnetic device further comprises a synthetic antiferromagnetic (SAF) layer comprised of the magnetic reference layer, a non-magnetic exchange coupling layer and a magnetic pinned layer. The magnetic reference layer is disposed over the non-magnetic exchange coupling layer. The non-magnetic exchange coupling layer is disposed over the magnetic pinned layer. The magnetic reference layer is shared with the magnetic tunnel junction.

In another embodiment, the exchange coupling layer of the magnetic device comprises Ru having a thickness from 0.4 to 1.5 nm.

In another embodiment, the magnetic pinned layer comprises CoFe having a thickness of 1 to 10 nm.

In another embodiment, the reference layer has a fixed magnetic direction in its plane while the free layer has a variable magnetic direction. The variable magnetic direction can be either parallel or antiparallel to the magnetic direction of the reference layer.

In another embodiment, the magnetic device includes a tantalum hard mask disposed above the spin current injection capping layer.

In another embodiment, the tantalum hard mask has a thickness of 20 nm to 100 nm.

In another embodiment, the magnetic reference layer is comprised of CoFeB having a thickness of 1 to 10 nm.

In another embodiment, the non-magnetic tunneling barrier layer is comprised of MgO having a thickness of 0.5 nm to 1.5 nm.

In another embodiment, the magnetic free layer is comprised of CoFeB having a thickness of 0.8 to 5.0 nm.

In another embodiment, the magnetic polarizer layer comprises a first magnetic layer having a magnetic vector with a magnetic direction that is perpendicular to its plane, thereby forming a perpendicular layer. The magnetic polarizer layer also includes a non-magnetic exchange coupling layer disposed over the first magnetic layer and a second magnetic layer disposed over the non-magnetic exchange coupling layer. The first and second magnetic layers are anti-ferromagnetically coupled.

In another embodiment, the first magnetic layer of the magnetic polarizer is comprised of Co having a thickness of 0.1 to 2 nm.

In another embodiment, the non-magnetic exchange coupling layer is comprised of Ru having a thickness of 0.4 to 1.5 nm.

In another embodiment, the second magnetic layer is comprised of Co having a thickness of 0.1 to 2.0 nm and a layer of Pt having a thickness of 0.1 to 2.0 nm.

In another embodiment, the non-magnetic insulator comprised of MgO having a thickness of 0.3 to 1.5 nm.

In another embodiment, the magnetic conductor of the spin current injection capping layer is comprised of high spin polarization material.

In another embodiment, the high spin polarization material comprises Co (cobalt), Fe (iron), CoFe (cobalt iron), or CoFeB (cobalt iron boron) having a thickness of 0.5 nm to 1 nm.

In another embodiment, the magnetic device includes a polarizer seed and magnetic coupling layer disposed between the spin current injection capping layer and the magnetic polarizer layer.

In another embodiment, the polarizer seed and magnetic coupling layer is disposed between the spin current injection capping layer and the magnetic polarizer layer.

In another embodiment, the polarizer seed and magnetic coupling layer comprises a layer of Ta having a thickness of 0.2 nm to 0.7 nm and a layer of Co having a thickness of 0.1 nm to 2 nm.

In another embodiment, a magnetic device includes a synthetic antiferromagnetic structure in a first plane. The synthetic antiferromagnetic structure includes a magnetic reference layer. The magnetic reference layer has a magnetization vector that is parallel to the first plane. The magnetic device also includes a non-magnetic tunnel barrier layer in a second plane and disposed over the magnetic reference layer. The magnetic device further includes a free magnetic layer in a third plane disposed over the non-magnetic tunnel barrier layer. The free magnetic layer has a magnetization vector that is parallel to the third plane and has a magnetization direction that can precess from a first magnetization direction to a second magnetization direction. The magnetic device includes a spin current injection capping layer in a fourth plane. The spin current injection capping layer is disposed over the free magnetic layer and comprises a non-magnetic insulator layer over the free magnetic layer and a magnetic conductor layer over the non-magnetic insulator layer. The magnetic device also includes a magnetic polarizer layer that polarizes electrons passing therethrough to create spin polarized current. The magnetic polarizer layer has a magnetic vector that is orthogonal to the magnetization vector of the magnetic reference layer and the magnetization vector of the free magnetic layer. The spin current injection capping layer injects the spin polarized current into the magnetic tunnel junction through tunneling.

In another embodiment, the free layer comprises of a layer of CoFeB with a thickness of 0.8 nm to 5 nm.

In another embodiment, the non-magnetic insulator layer of the spin current injection capping layer comprises a layer of MgO having a thickness of 0.3 nm to 1.5 nm.

In another embodiment, the magnetic conductor layer of the spin current injection capping layer is comprised of high spin polarization material.

In another embodiment, the high spin polarization material comprises Co (cobalt), Fe (iron), CoFe (cobalt iron), or CoFeB (cobalt iron boron) having a thickness of 0.5 nm.

In another embodiment, the magnetic device further comprises an insertion layer, the insertion layer being disposed in between the free magnetic layer and the non-magnetic tunnel barrier layer.

In another embodiment, the insertion layer comprises an Fe film having a thickness of 0.2 nm to 0.5 nm.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
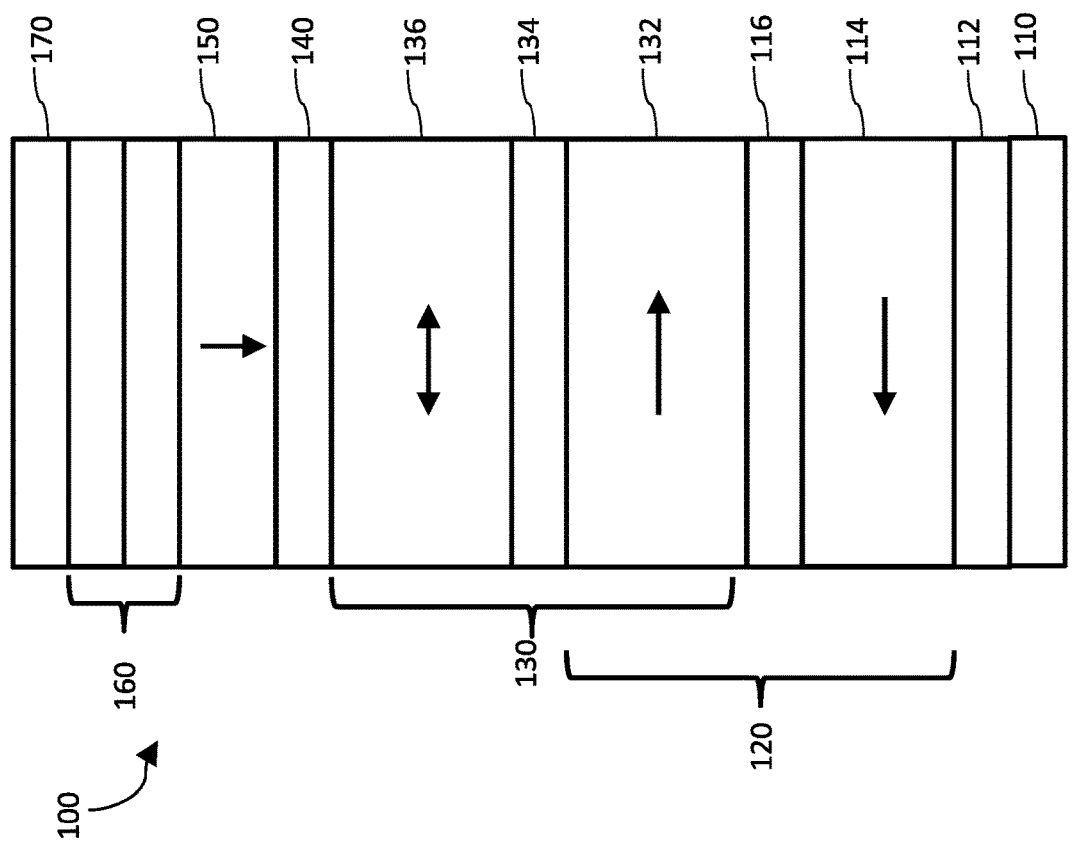
FIG. 1 illustrates a conventional MTJ stack for an MRAM device with a perpendicular polarizer.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

The present patent document discloses an orthogonal spin transfer torque structure with an MgO/ferromagnet cap disposed between a polarizing layer and a Fe/CoFeB free layer structure of an MTJ, which provides for high efficiency spin transfer torque and low critical current switching MRAM application. The cap structure acts as a spin current injection layer, and unlike previous devices, electron transport into the MTJ is through tunneling and not diffusive transfer.

Note that MgO is Magnesium Oxide. Fe is Iron. CoFeB is cobalt iron boron. As used herein, dMgO stands for "dual MgO," which represents the main barrier MgO (located between the free layer and the reference layer of an MTJ) and the MgO portion of a spin current injection layer (located between the polarizer layer and the free layer of the MTJ). OST stands for orthogonal spin transfer.

An embodiment of an OST-MRAM memory cell 200 utilizing cap structure 260 that acts as a spin injection layer is described with reference to FIG. 2. The embodiment shown in FIG. 2 has a perpendicular synthetic antiferromagnetic (SAF) polarizer 250 and an in-plane MTJ 230. As will be discussed, the magnetic layers of an in-plane MTJ like that shown in FIG. 2 have their magnetic vectors in the plane of the layer.

OST-MRAM memory cell 200 comprises a bottom electrode 210. Bottom electrode 210 can comprise Ta and CuN layers where the Ta layer can have a thickness of 0.5 nm to 10 nm and the CuN layer can have a thickness of 2 nm to 100 nm. Alternatively, bottom electrode 210 can comprise a layer of Ta having a thickness of 0.5 nm to 10 nm. A seed Layer 211 is disposed over bottom electrode 210. Seed layer 211 can comprise a layer of Cu having a thickness of 0.5 nm to 20 nm. An antiferromagnetic layer 212 is disposed over seed layer 211 and can comprise PtMn having a thickness of 12 nm to 30 nm.

A first synthetic antiferromagnetic (SAF) layer 240 is placed over antiferromagnetic layer 212. First SAF layer 240 is comprised of several layers, including a pinned layer 213, an exchange coupling layer 214 and a reference layer 215. Pinned layer 213 is constructed with a magnetic material, which in one embodiment can be 1 nm to 10 nm of CoFe. Pinned layer has a magnetization vector having a magnetic direction parallel to its plane. Exchange coupling layer 214 is disposed over pinned layer 213. Exchange coupling layer 214 is constructed of a non-magnetic material, which in one embodiment can be a layer of Ru having a thickness of 0.4 nm to 1.5 nm. First SAF layer 240 also comprises reference layer 215 disposed over exchange coupling layer 214. Reference layer is made with a magnetic material, which can comprise a CoFeB layer having a thickness of 1 nm to 10 nm. Reference layer 215 has a magnetization vector having a magnetic direction that is fixed and parallel to its plane (i.e., is in the plane of the layer). As will be seen, reference layer 215 is part of the first SAF layer 240 but also is part of MTJ 230. The magnetic vectors of reference layer 215 and pinned layer 213 are preferably in an antiparallel relationship with each other, as is seen in FIG. 2.

Magnetic tunnel junction 230 is disposed over first SAF 240, although, as discussed, reference layer 215 is considered as belonging to both MTJ 230 and first SAF layer 240. Magnetic tunnel junction 230 is comprised of reference layer 215, a tunneling barrier layer 216 and a free layer 218. Reference layer 215 was discussed in the context of first SAF layer 240, above. Tunneling barrier layer 216 is disposed over reference layer 215, and can comprise a layer of MgO having a thickness of 0.5 nm to 2.0 nm. Free layer 218 is disposed over tunneling barrier layer 216 and can comprise a layer of CoFeB having a thickness of 0.8 nm to 5 nm.

Figure 2:
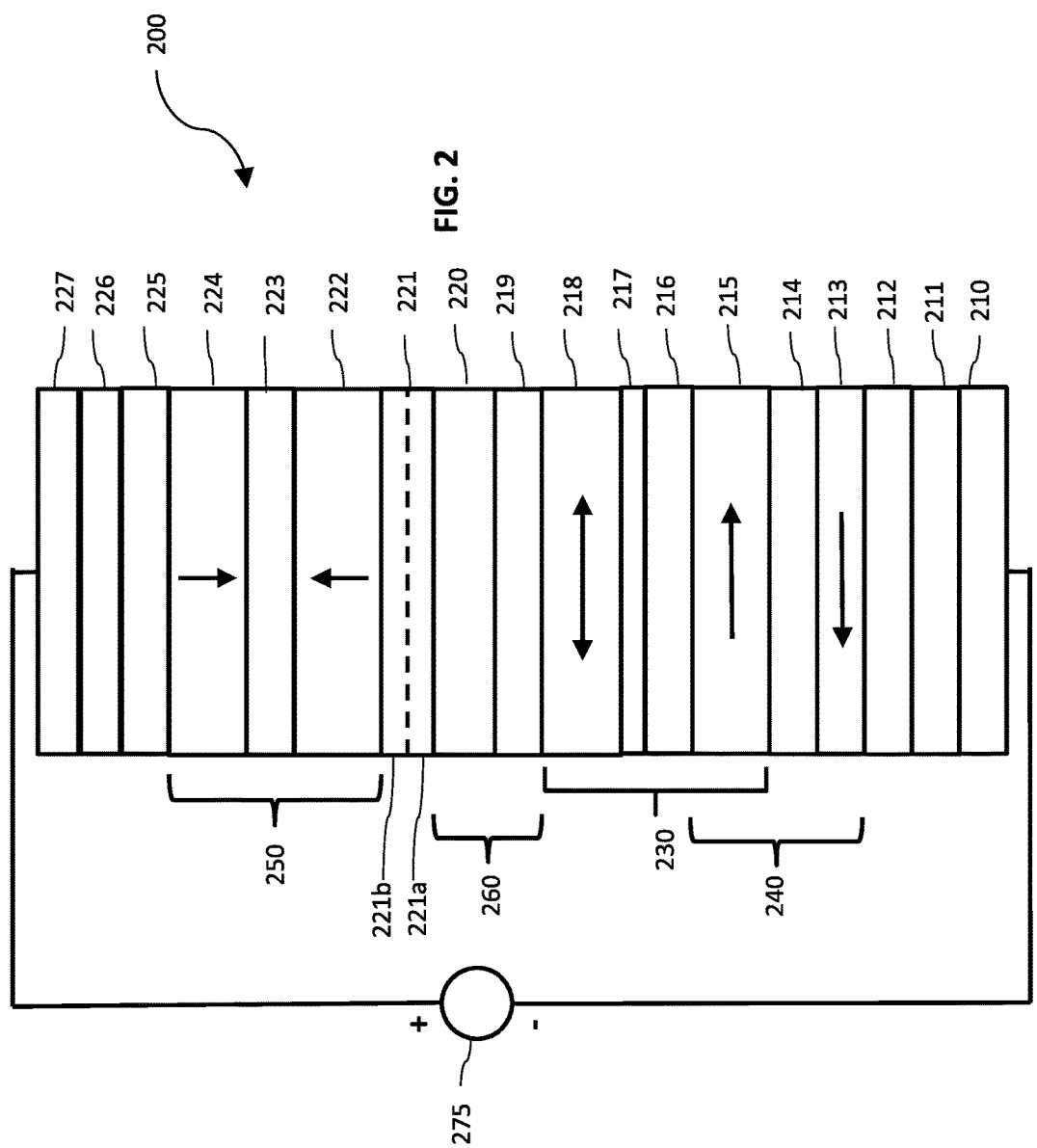
FIG. 2 illustrates an in-plane MTJ structure with perpendicular synthetic antiferromagnetic polarizer having a spacer in between the polarizer and the MTJ made up of a non-magnetic insulating layer and a magnetic conductor.

MTJ 230 of FIG. 2 is an in-plane MTJ device. Note than an insertion layer 217 comprised of an Fe film can be interposed between the tunneling barrier layer 216 and the free layer 218. Insertion layer 217 can have a thickness of 0.2 nm to 0.5 nm. Reference layer 215 has a magnetization vector having a magnetic direction that is fixed and parallel to its plane. Free layer 218 also has a magnetization vector having a magnetic direction parallel to its plane. However, the magnetization direction of the magnetization vector of free layer 218 can switch between two different directions. Tunneling barrier layer 216 is a non-magnetic layer and thus has no magnetization vector. When not in the process of being switched, the magnetic vectors of reference layer 215 and free layer 218 can either be in an antiparallel relationship or in a parallel relationship, depending on the state of the memory (i.e., whether the MRAM device is storing a logic level "1" or a logic level "0").

MRAM device 200 also includes a polarizer 250, which aligns the spins of electrons of electric current passing therethrough, thereby creating a spin current. Current can be provided, for example, by a current source 275. In this embodiment, polarizer 250 is a synthetic antiferromagnetic (SAF) structure comprised of several layers. A first magnetic layer 222 of polarizer 250, i.e., SAF, can be constructed of a magnetic material, and can comprise a layer of Co with a thickness of 0.1 nm to 2 nm and a layer of Pt with a thickness of 0.1 nm to 2 nm. First magnetic layer 222 of polarizer 250 has a magnetic vector with a magnetic direction that is perpendicular to its plane, thereby forming a perpendicular layer. A non-magnetic exchange coupling layer 223 is disposed over perpendicular layer 222. In one embodiment, non-magnetic exchange coupling layer 223 can be constructed with Ru having a thickness of 0.4 nm to 1.5 nm. Polarizer 250 also includes a second magnetic layer 224, which can be disposed over the non-magnetic exchange coupling layer 223. Second magnetic layer 224 is comprised of magnetic materials, and in an embodiment can comprise a layer of Co having a thickness of 0.1 nm to 2.0 nm and a layer of Pt having a thickness of 0.1 nm to 2.0 nm. The first and second magnetic layers 222 and 224 are anti-ferromagnetically coupled.

MRAM device 200 can also comprise a capping layer 225, which protects device 200 from oxidation. In an embodiment, capping layer 225 comprises Ta having a thickness of 0.5 nm to 20 nm. An additional capping layer 226 can be included, which further protects device 200 from oxidation. Capping layer 226 can be constructed of Ru with a thickness of 0.5 to 20 nm. Device 200 may also have a Ta or TaN hard mask 227, which can have a thickness of 20 nm to 100 nm, and in one embodiment has a thickness of 70 nm.

Device 200 also includes a spin current injection capping layer 260 disposed between the polarizer 250 and free layer 218 of the MTJ 230. Spin current injection capping layer 260 enables spin current injection into MTJ 230 via a tunneling process, and comprises a non-magnetic insulating layer 219 and an adjacent ferromagnetic layer 220. The non-magnetic insulating layer 219 of spin current injection capping layer 260 can be constructed using MgO and can have a thickness of 0.3 nm to 1.5 nm. Ferromagnetic layer 220 can be constructed of a high spin polarization material such as Co, Fe, CoFe (cobalt iron), or CoFeB (cobalt iron boron) having a thickness of 0.3 to 3 nm, and preferably has a thickness of 0.5 nm to 0.9 nm.

Unlike previous cap structures placed between the MTJ and the polarizer that use ballistic or diffusive electron transport (e.g., Redon, discussed above), spin current injection capping layer 260 transmits electrons by tunneling between the free layer 218 and the ferromagnetic layer 220, which is ferromagnetically coupled to the orthogonal polarizer 250. A polarizer seed and magnetic coupling layer 221 can be disposed between the spin current injection capping layer 260 and the polarizer 250. Polarizer seed and magnetic coupling layer 221 can comprise a layer of Ta 221a having a thickness of 0.2 nm to 7 nm and a layer of Co 221b having a thickness of 0.1 nm to 2 nm.

Spin current injection capping layer 260 improves the control of the amount of spin transfer torque (STT) from the polarizer layer to the magnetic free layer 218. Spin current injection capping layer 260 maximizes the spin torque through very efficient spin current injection from the polarizer while enabling: 1) High tunnel magnetoresistance (TMR) with desirable resistance area product (often referred to as "RA," where resistance (R) of the device is measured through the thickness of the layers when the magnetization of the free layer 218 and reference layer 215 are parallel, and A is the area of the device), 2) Lower free layer damping constant, and 3) Lower free layer effective magnetization.

Spin current injection capping layer 260 also significantly improves magnetic properties of a free layer 218 by providing a better template for crystallization of the CoFeB material during the annealing process used during fabrication. Spin current injection capping layer 260 provides high interface perpendicular magnetic anisotropy (IPMA), which reduces effective magnetization significantly compared to Ta or Cu metal capping materials. This results in a reduction in the amount of switching current needed to switch the magnetic direction of the magnetic free layer 218.

In MTJ 230, tunneling barrier layer 216 resides between the reference layer 215 and free layer 218. As discussed, tunneling barrier layer 216 is constructed using a non-magnetic insulator material such as MgO. The interaction between tunneling barrier layer 216 and free layer 218 is largely fixed, but the layers that are deposited on top of free layer 218 can modify the free layer properties.

Figure 3:
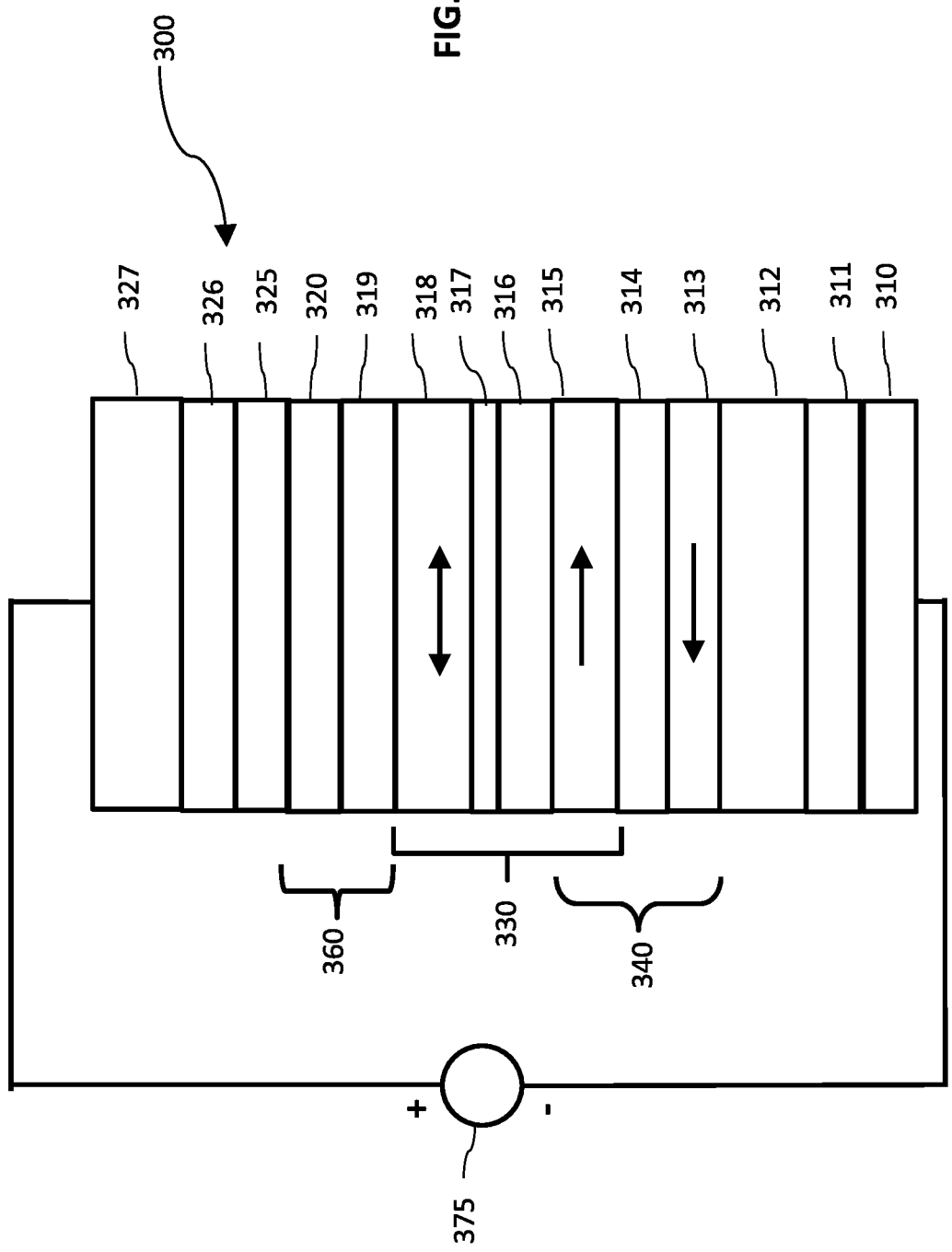
FIG. 3 illustrates an in-plane MTJ without a polarizer having a cap over the MTJ made up of a non-magnetic insulating layer and a magnetic conductor.

An embodiment of an MRAM memory cell 300 utilizing an MgO cap structure as a spin injection layer that does not utilize a polarizer layer is described with reference to FIG. 3. The embodiment shown in FIG. 3 is an in-plane MTJ 330 that, unlike the embodiment in FIG. 2, does not have a polarizer. OST-MRAM memory cell 300 comprises a bottom electrode 310. Bottom Electrode 310 can comprise Ta and CuN layers where the Ta layer can have a thickness of 0.5 to 10 nm and the CuN layer can have a thickness of 2 to 100 nm. Alternatively, bottom electrode 310 can comprise a layer of Ta having thickness of 0.5 to 10 nm. A seed layer 311 is disposed over bottom electrode 310. Seed layer 311 can comprise a layer of Cu having thickness of 0.5 to 20 nm. An antiferromagnetic layer 312 is disposed over seed layer 311 and can comprise a 12 nm to 30 nm layer of PtMn.

A pinned antiferromagnetic layer 313 of synthetic antiferromagnetic (SAF) layer 340 is placed over antiferromagnetic layer 312. SAF layer 340 is comprised of several layers, including a pinned layer 313, an exchange coupling layer 314 and a reference layer 315. Pinned layer 313 is disposed over antiferromagnetic layer 312. Pinned layer 313 is constructed with a magnetic material, which in one embodiment can be 1 nm to 10 nm of CoFe. Pinned layer 313 has a magnetization vector having a magnetic direction parallel to its plane. Exchange coupling layer 314 is disposed over pinned layer 313. Exchange coupling layer 314 is constructed of a non-magnetic material, which in one embodiment can be a layer of Ru having a thickness of 0.4 nm to 1.5 nm.

SAF layer 340 also comprises reference layer 315 disposed over exchange coupling layer 314. Reference layer 315 is made with a magnetic material, which can comprise a CoFeB layer having a thickness of 1 nm to 10 nm. Reference layer 315 has a magnetization vector having a magnetic direction that is fixed and parallel to its plane (i.e., is in the plane of the layer). As will be seen, reference layer 315 is part of the first SAF layer 340 but also is part of MTJ 330. The magnetic vectors of reference layer 315 and pinned layer 313 are in an antiparallel relationship with each other, as is seen in FIG. 3.

Magnetic tunnel junction 330 is comprised of reference layer 315, a tunneling barrier layer 316 and a free layer 318. Tunneling barrier 316 is disposed over reference layer 315, and can comprise a layer of MgO having a thickness of 0.5 nm to 1.5 nm. Free layer 318 is disposed over tunneling barrier layer 316 and can comprise a layer of CoFeB having a thickness of 0.8 nm to 5 nm. MTJ 330 is an in-plane device. An insertion layer 317 comprised of an Fe film can be interposed between the tunneling barrier layer 316 and the free layer 318. Insertion layer 317 can have a thickness of 0.2 nm to 0.5 nm. Reference layer 315 has a magnetization vector having a magnetic direction that is fixed and parallel to its plane. However, the magnetization direction of the magnetization vector of free layer 318 can switch between two directions. Tunneling barrier layer 316 is a non-magnetic layer and thus has no magnetization vector. When not in the process of being switched, the magnetic vectors of reference layer 315 and free layer 318 can either be in an antiparallel relationship or in a parallel relationship, depending on the state of the memory (i.e. whether the MRAM device is storing a logic level "1" or a logic level "0").

In MTJ 330, tunneling barrier layer 316 resides between the reference layer 315 and free layer 318. As discussed, tunneling barrier layer 316 is constructed using a non-magnetic insulator material such as MgO. The interaction between tunneling barrier layer 316 and free layer 318 is largely fixed, but the layers that are deposited on top of free layer 318 can modify the free layer properties.

Device 300 also includes a capping layer 360 above free layer 318 of the MTJ 330. Capping layer 360 enables current injection into MTJ 330 via a tunneling process, and comprises a non-magnetic insulating layer 319 and an adjacent ferromagnetic layer 320. Current can be provided, for example, by a current source 375. The non-magnetic insulating layer 319 of capping layer 360 can be constructed using MgO and can have a thickness of 0.3 to 1.5 nm. Ferromagnetic layer 320 can be constructed of a high spin polarization material such as Co, Fe, CoFe (cobalt iron), or CoFeB (cobalt iron boron) having a thickness of 0.3 nm to 3 nm, and preferably having a thickness of 0.5 nm to 1.5 nm.

MRAM device 300 can also include one or more capping layers 325 and 326, which further protect the device from oxidation. Capping layer 325 can be constructed of Tantalum nitride (TaN) with a thickness of 0.5 nm to 20 nm. Alternatively, capping layer 325 can be constructed of Tantalum (Ta). Capping layer 326 can be constructed of Ru with a thickness of 0.5 to 20 nm. Device 300 may also have a Ta hard mask 327, which can have a thickness of 20 nm to 100 nm, and in one embodiment has a thickness of 70 nm.

Figure 4A:
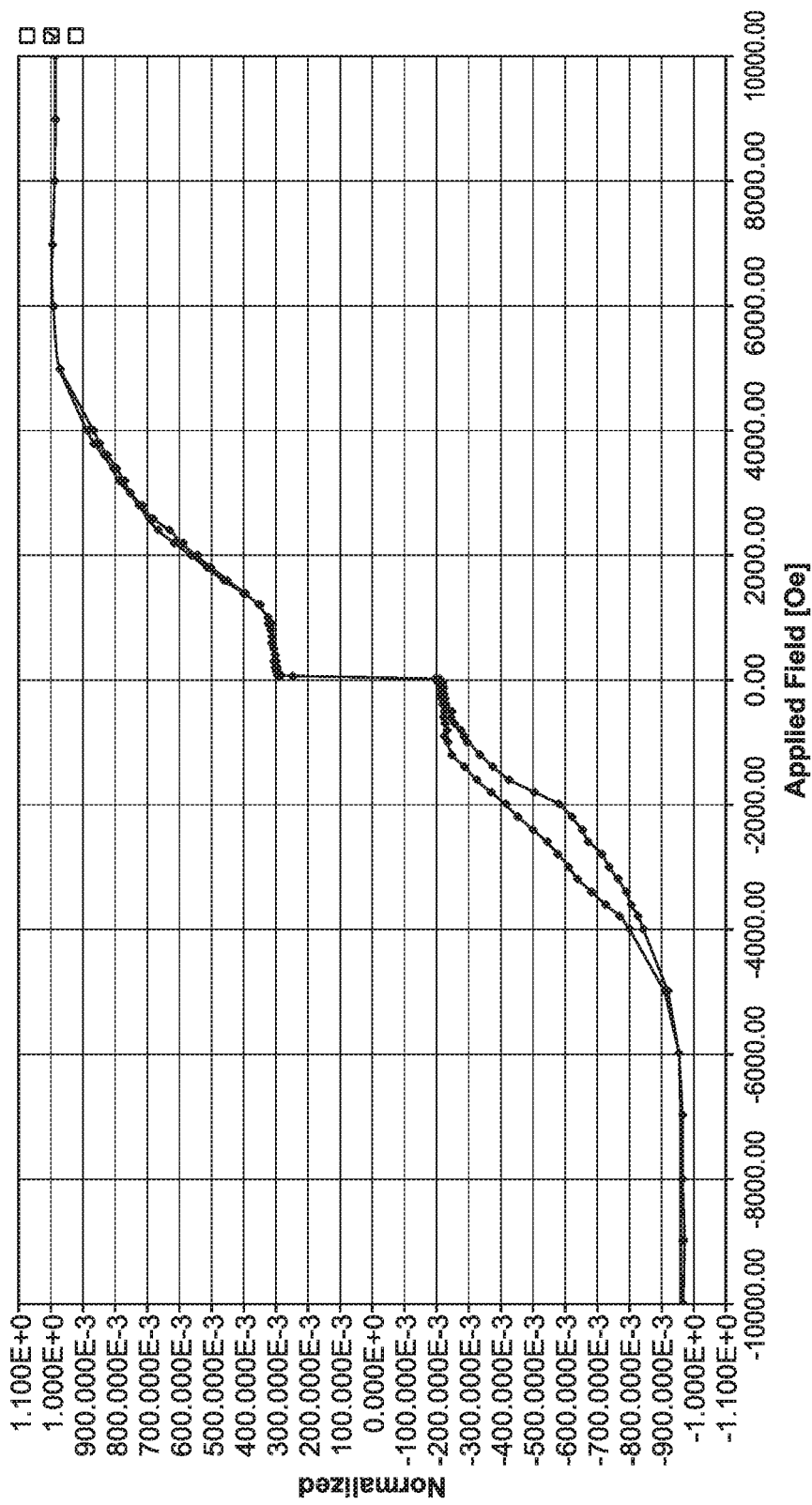
FIGS. 4A and 4B illustrate a VSM Major Hysteresis loop for MTJ structure with 0.85MgO/0.5CoFeB free layer cap.
Figure 4B:
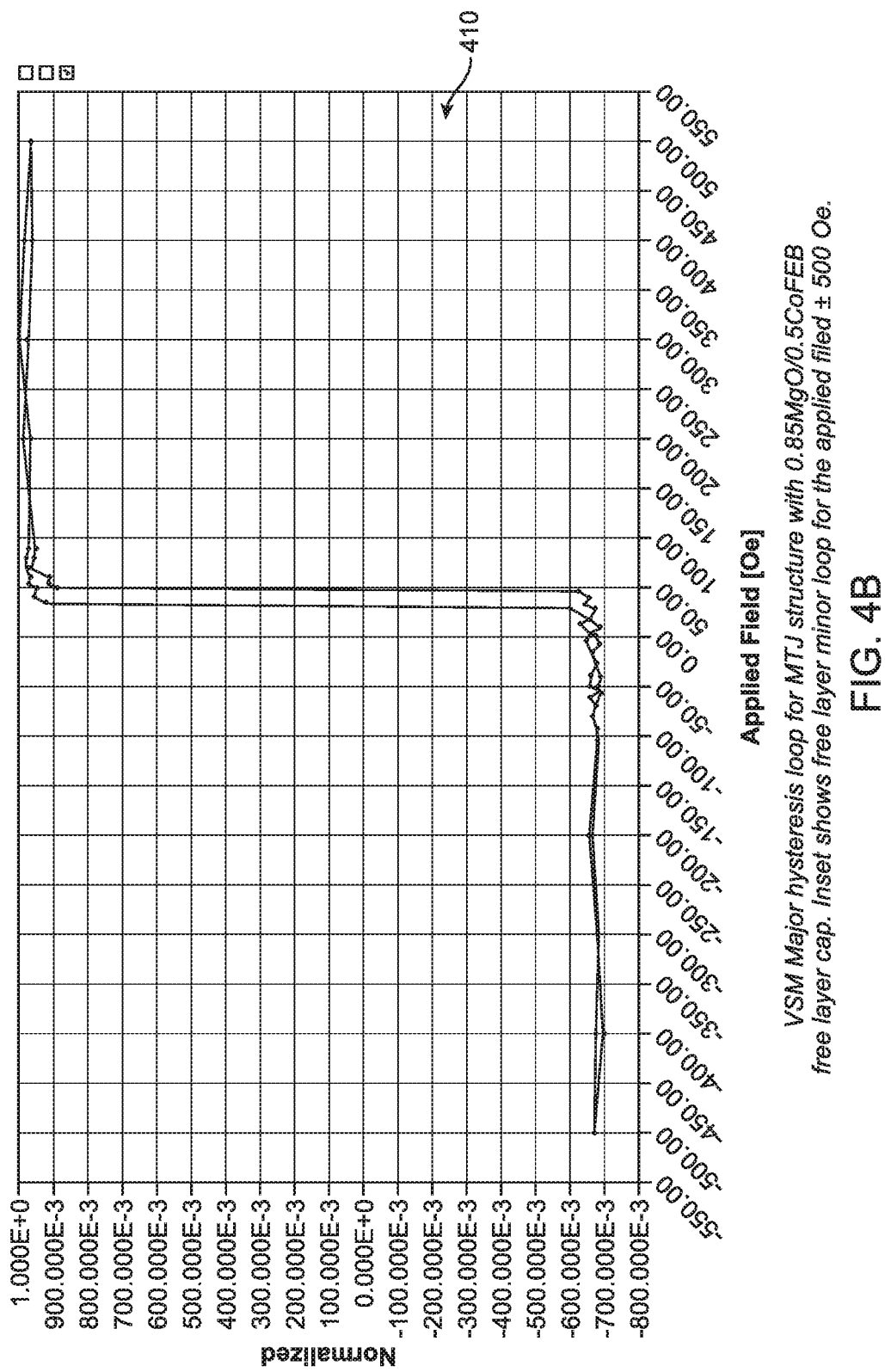

Tests have been conducted to show the performance parameters of the MTJ structures described herein. FIG. 4A illustrates vibrating sample magnetometer (VSM) Major hysteresis loop of a magnetic structure 300 including MTJ 330 and spin current injection capping layer 360 comprised of a layer of MgO having a thickness of 0.85 nm and a layer of CoFeB having a thickness of 0.5 nm. Capping layers 325 and 326 comprised 5 nm of Ta and 7 nm or Ru, respectively, were deposited for protection of the magnetic layers below. FIG. 4B shows the low coercivity of magnetic free layer 318 of MTJ 330 with a spin current injection capping layer 360.

Figure 5:
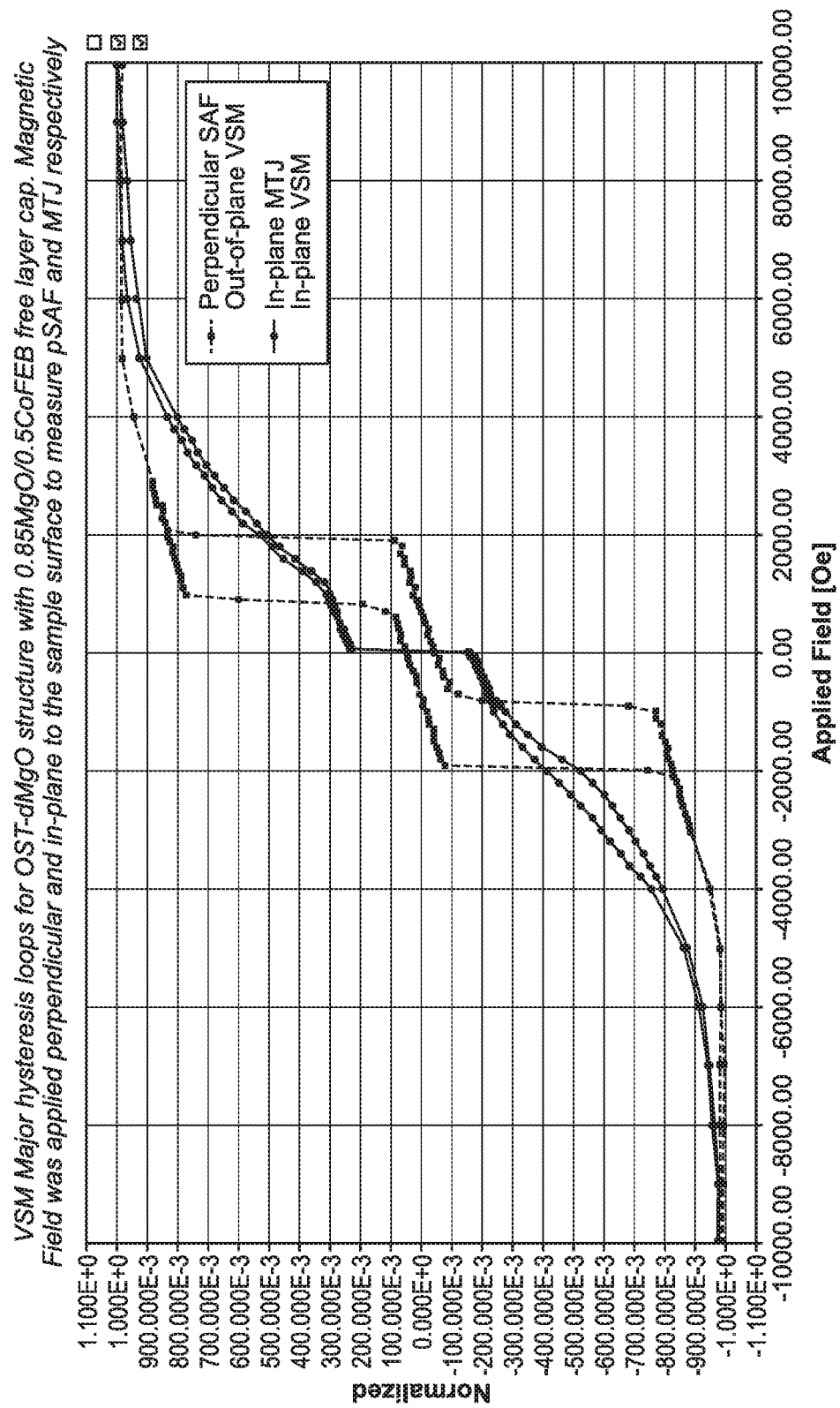
FIG. 5 illustrates VSM Major Hysteresis loops for a device with a perpendicular synthetic antiferromagnet as a polarizer having an MTJ capping structure comprising a 0.85 nanometers (nm) layer of magnesium oxide (MgO), which is a non-magnetic insulator, and a layer of CoFeB, which is a magnetic conductor.

FIG. 5 illustrates major hysteresis loops for device 200 with 0.85 nm MgO/0.5 nm CoFeB spin current injection capping layer 260. Magnetic Field was applied perpendicular and in-plane to the sample surface to measure perpendicular SAF polarizer 250 and in-plane MTJ, respectively. As seen in FIG. 5, perpendicular SAF polarizer 250 shows significantly increased exchange coupling field and coercivity.

In order to decrease critical switching current in in-plane MTJ structures, it is necessary to achieve low values of effective Magnetization ($4\pi M_{eff}$, magnetic damping parameter ($\alpha$) and coercivity ($H_c$) of free layer without sacrificing high Tunneling Magnetoresistance (TMR) values. At the same time, high $M_s$*t values are required for device thermal stability. Previous OST-MTJ approaches addressed these issues but separately, i.e. one could not achieve low values for $4\pi M_{eff}$ and $\alpha$, and high TMR and $M_s$*t at the same time.

Table 1 illustrates magnetic properties of the free layer in OST dMGO structure in comparison with devices using other capping structures over the free layer. From left to right, the columns show various properties of MTJ devices having different capping structures over the free layer. A first device includes an MTJ with a 10 nm Cu cap over the free layer. This corresponds to the spacer between the polarizer layer and free layer of the MTJ in Redon (discussed above).

A second device includes an MTJ with a 2 nm TaN cap over the free layer. A third device includes an MTJ with a cap comprised 0.3 nm layer of MgO over the free layer and a 2 nm layer of TaN on the MgO.

A fourth device, shown in the column furthest to the right, corresponds with the devices shown in FIGS. 2 and 3 herein, and shows the performance improvements for a device having a 0.85 nm layer of MgO over the free layer with a 0.5 nm layer of CoFeB over the MgO layer. The $4\pi M_s$ values were calculated from $M_s$ and t and nominal thickness of the free layer for each sample. In this embodiment, device comprised the following materials and thicknesses:

Bottom electrode 310: 3 nm layer of Ta, 40 nm layer of CuN, and 5 nm layer of Ta.
Seed layer 311: 1.5 nm layer of Cu.
Antiferromagnetic layer 312: 16.5 nm layer of PtMn.
Pinned layer 313: 2.1 nm layer of CoFe.
Exchange coupling layer 314: 0.9 nm layer of Ru.
Reference layer 315: 2.3 nm layer of CoFeB.
Tunneling barrier layer 316: 1.02 nm layer of MgO.
Insertion layer 317: 0.2 nm of layer Fe.
Free layer 318: 1.4 nm layer of CoFeB.
Non-magnetic insulating layer 319: 0.85 nm layer of MgO.
Ferromagnetic layer 320: 0.5 nm layer of CoFeB.
Capping layer 325: 5 nm layer of TaN.
Capping layer 326: 7 nm layer of Ru.
Hard Mask 327: 70 nm layer of Ta.

| Performance Parameter | Units | 10 nm Cu Free Layer Cap Current orthogonal MTJ structure | 2 nm TaN Free Layer cap | 0.3 nm MgO and 2 nm TaN Free Layer cap | 0.85 nm MgO and 0.5 nm CoFeB Free Layer cap |
|---|---|---|---|---|---|
| $M_s{}^* t$ | (emu/c$\hat{\ }$2) | 312 | 200 | 188 | 220 |
| thickness | (nm) | 2.3 | 2.0 | 1.85 | 1.6 |
| $*4\pi M_s$ | [T] | 1.7 | 1.25 | 1.27 | 1.7 |
| $H_c$ | [mT] | 1.25 | 1.5 | 1.45 | 0.70 |
| $4\pi M_{eff}$ | [T] | 1.01 | ~0.75 | 0.67 | 0.4 |
| $H_{shift}$ | [mT] | 3.0 | 3.5 | 3.2 | 3.4 |
| Damping ($\alpha$) | | 0.017 | 0.01 | 0.0085 | 0.0055 |
| TMR | [%] | 84 | 158 | 160 | 146 |
| RA | [Ohm $\mu m^2$] | 4.3 | 11 | 10.3 | 9.6 |

As can be seen in Table 1, magnetic properties of a free layer with a 0.85 nm MgO/0.5 nm CoFeB spin current injection capping layer are superior to prior solutions. On average, $4\pi M_{eff}$ and $\alpha$ decreased significantly. For example, damping ($\alpha$) was significantly lower when using a spin current injection capping layer as described herein, meaning that a device using this structure is easier to switch than all prior solutions. Likewise, $4\pi M_{eff}$ was significantly lower, which allows reduction in the magnetic moment used for switching, which corresponds in the need for lower switching currents. At the same time, TMR remained high at approximately 146. Based on thin film properties from Table 1, such combination of magnetic and electric properties in a device using a 0.85 nm MgO/0.5 nm CoFeB spin current injection capping layer lowers critical switching when compared to previous approaches. In addition, a significant decrease of the free layer switching time is expected due to efficient injection of perpendicular spin torque through 0.85 nm MgO/0.5 nm CoFeB spin injection cap from the perpendicular p-SAF polarizer.

All of the layers of devices 200 and 300 illustrated in FIGS. 2 and 3 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stacks are well-known to those skilled in the art and will not be described in detail herein so as not to unnecessarily obscure aspects of the disclosure herein.

It should be appreciated to one skilled in the art that a plurality of MTJ structures 200 and 300 can be manufactured and provided as respective bit cells of an STT-MRAM device. In other words, each MTJ stack 200, 300 can be implemented as a bit cell for a memory array having a plurality of bit cells.

In an embodiment, a device 200 will have the following layers:

Bottom electrode 210: 3 nm layer of Ta, 40 nm layer of CuN and 5 nm layer of Ta.
Seed layer 211: 1.5 nm layer of Cu.
Antiferromagnetic layer 212: 16.5 nm layer of PtMn.
Pinned layer 213: 2.1 nm layer of CoFe.
Exchange coupling layer 214: 0.9 nm layer of Ru.
Reference layer 215: 2.3 nm layer of CoFeB.
Tunneling barrier layer 216: 1.02 nm layer of MgO.
Insertion layer 217: 0.2 nm layer of Fe.
Free layer 218: 1.4 nm layer of CoFeB.
Non-magnetic insulating layer 219: 0.85 nm layer of MgO.
Ferromagnetic layer 220: 0.5 nm layer of CoFeB.
Polarizer seed and magnetic coupling layer 221: 0.4 nm layer of Ta and 0.6 nm layer of Co, with the Co above the Ta.

A Polarizer layer 250 constructed as a synthetic antiferromagnet comprised of:

(i) First magnetic layer 222: 0.55 nm layer of Pt and a 0.3 nm layer of Co, which in an embodiment be repeated five times.

(ii) Non-magnetic exchange coupling layer 223: 0.9 nm layer of Ru.

(iii) Second magnetic layer 224: 0.3 nm layer of Co and 0.55 nm layer of Pt, which in an embodiment be repeated seven times.

Capping layer 225: 5 nm layer of Ta.

Capping layer 226: 7 nm layer of Ru.

Hard Mask: 70 nm layer of Ta.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising
   a synthetic antiferromagnetic structure in a first plane, the synthetic antiferromagnetic structure including a magnetic reference layer, the magnetic reference layer having a magnetization vector,
   a non-magnetic tunnel barrier layer in a second plane and disposed over the magnetic reference layer;
   a free magnetic layer in a third plane disposed over the non-magnetic tunnel barrier layer, the free magnetic layer having a magnetization vector and having a magnetization direction that can precess from a first magnetization direction to a second magnetization direction, the free magnetic layer, the non-magnetic tunnel barrier layer and the magnetic reference layer forming a magnetic tunnel junction;
   a spin current injection capping layer in a fourth plane, the spin current injection capping layer disposed over the free magnetic layer, the spin current injection capping layer comprising a non-magnetic insulator layer over the free magnetic layer and a magnetic conductor layer over the non-magnetic insulator layer; and
   a magnetic polarizer layer that polarizes electrons passing therethrough to create spin polarized current, the magnetic polarizer layer having at least one magnetic vector, the at least one magnetic vector being orthogonal to the magnetization vector of the magnetic reference layer and the magnetization vector of the free magnetic layer;
   wherein the spin current injection capping layer is between the magnetic polarizer layer and the free magnetic layer and wherein the spin current injection capping layer injects the spin polarized current into the magnetic tunnel junction through tunneling between the magnetic conductor layer and the free magnetic layer.

2. The magnetic device of claim 1 wherein the free magnetic layer comprises of a layer of CoFeB with a thickness of 0.8 nm to 5 nm.

3. The magnetic device of claim 1 wherein the non-magnetic insulator layer of the spin current injection capping layer comprises a layer of MgO having a thickness of 0.3 nm to 1.5 nm.

4. The magnetic device of claim 1 wherein the magnetic conductor layer of the spin current injection capping layer is comprised of high spin polarization material.

5. The magnetic device of claim 4 wherein the high spin polarization material comprises Co (cobalt), Fe (iron), CoFe (cobalt iron), or CoFeB (cobalt iron boron) having a thickness of 0.5 nm to 1nm.

6. The magnetic device of claim 1, further comprising an insertion layer, the insertion layer being disposed in between the free magnetic layer and the non-magnetic tunnel barrier layer.

7. The magnetic device of claim 6, wherein the insertion layer comprises an Fe film having a thickness of 0.2 nm to 0.5 nm.

8. The magnetic device of claim 1 wherein the at least one magnetic vector of the magnetic polarizer layer comprises magnetic vector with a direction that is fixed.

9. A magnetic device, comprising
   a synthetic antiferromagnetic structure in a first plane, the synthetic antiferromagnetic structure including a magnetic reference layer, the magnetic reference layer having a magnetization vector,
   a non-magnetic tunnel barrier layer in a second plane and disposed over the magnetic reference layer;
   a free magnetic layer in a third plane disposed over the non-magnetic tunnel barrier layer, the free magnetic layer having a magnetization vector and having a magnetization direction that can precess from a first magnetization direction to a second magnetization direction, the free magnetic layer, the non-magnetic tunnel barrier layer and the magnetic reference layer forming a magnetic tunnel junction; and
   a spin current injection capping layer in a fourth plane, the spin current injection capping layer disposed over the free magnetic layer, the spin current injection capping layer comprising a non-magnetic insulator layer over the free magnetic layer and a magnetic conductor layer over the non-magnetic insulator layer, wherein the spin current injection capping layer injects the spin polarized current into the magnetic tunnel junction through tunneling.

10. The magnetic device of claim 9 wherein the free magnetic layer comprises of a layer of CoFeB with a thickness of 0.8 nm to 5 nm.

11. The magnetic device of claim 9 wherein the non-magnetic insulator layer of the spin current injection capping layer comprises a layer of MgO having a thickness of 0.3 nm to 1.5 nm.

12. The magnetic device of claim 9 wherein the magnetic conductor layer of the spin current injection capping layer is comprised of high spin polarization material.

13. The magnetic device of claim 12 wherein the high spin polarization material comprises Co (cobalt), Fe (iron), CoFe (cobalt iron), or CoFeB (cobalt iron boron) having a thickness of 0.5 nm to 1.5 nm.

14. The magnetic device of claim 9, further comprising an insertion layer, the insertion layer being disposed in between the free magnetic layer and the non-magnetic tunnel barrier layer.

15. The magnetic device of claim 14, wherein the insertion layer comprises an Fe film having a thickness of 0.2 nm to 0.5 nm.

16. A magnetic device, comprising
   a magnetic reference layer in a first plane, the magnetic reference layer having a magnetization vector,
   a non-magnetic tunnel barrier layer in a second plane and disposed over the magnetic reference layer;
   a free magnetic layer in a third plane disposed over the non-magnetic tunnel barrier layer, the free magnetic layer having a magnetization vector and having a magnetization direction that can precess from a first magnetization direction to a second magnetization direction, the free magnetic layer, the non-magnetic tunnel barrier layer and the magnetic reference layer forming a magnetic tunnel junction;
   a spin current injection capping layer in a fourth plane, the spin current injection capping layer disposed over the free magnetic layer, the spin current injection capping layer comprising a non-magnetic insulator layer over the free magnetic layer and a magnetic conductor layer over the non-magnetic insulator layer; and a magnetic polarizer layer that polarizes electrons passing therethrough to create spin polarized current, the magnetic polarizer layer having at least one magnetic vector, the at least one magnetic vector being orthogonal to the magnetization vector of the magnetic reference layer and the magnetization vector of the free magnetic layer;

wherein the spin current injection capping layer is between the magnetic polarizer layer and the free magnetic layer and wherein the spin current injection capping layer injects the spin polarized current into the magnetic tunnel junction through tunneling between the magnetic conductor layer and the free magnetic layer.

17. The magnetic device of claim 16 wherein the free magnetic layer comprises of a layer of CoFeB with a thickness of 0.8 nm to 5 nm.

18. The magnetic device of claim 16 wherein the non-magnetic insulator layer of the spin current injection capping layer comprises a layer of MgO having a thickness of 0.3 nm to 1.5 nm.

19. The magnetic device of claim 16 wherein the magnetic conductor layer of the spin current injection capping layer is comprised of high spin polarization material.

20. The magnetic device of claim 19 wherein the high spin polarization material comprises Co (cobalt), Fe (iron), CoFe (cobalt iron), or CoFeB (cobalt iron boron) having a thickness of 0.5 nm to 1 nm.

21. The magnetic device of claim 16, further comprising an insertion layer, the insertion layer being disposed in between the free magnetic layer and the non-magnetic tunnel barrier layer.

22. The magnetic device of claim 21, wherein the insertion layer comprises an Fe film having a thickness of 0.2 nm to 0.5 nm.

23. The magnetic device of claim 16 wherein the at least one magnetic vector of the magnetic polarizer layer comprises magnetic vector with a direction that is fixed.

* * * * *